United States Patent
Hensler et al.

(10) Patent No.: US 9,632,147 B2
(45) Date of Patent: Apr. 25, 2017

(54) METHOD FOR TESTING MULTIPLE SPATIALLY DISTRIBUTED PROTECTIVE DEVICES OF AN ENERGY SUPPLY NETWORK, AND CORRESPONDING TESTING SYSTEM

(71) Applicant: OMICRON ELECTRONICS GMBH, Klaus (AT)

(72) Inventors: Thomas Hensler, Klaus (AT); Stefan Schwabe, Berlin (DE)

(73) Assignee: OMICRON ELECTRONICS GMBH, Klaus (AT)

( * ) Notice: Subject to any disclaimer, the term of this patent is extended or adjusted under 35 U.S.C. 154(b) by 29 days.

(21) Appl. No.: 14/768,809

(22) PCT Filed: Feb. 19, 2014

(86) PCT No.: PCT/EP2014/053190
§ 371 (c)(1),
(2) Date: Aug. 19, 2015

(87) PCT Pub. No.: WO2014/128144
PCT Pub. Date: Aug. 28, 2014

(65) Prior Publication Data
US 2016/0003921 A1 Jan. 7, 2016

(30) Foreign Application Priority Data
Feb. 20, 2013 (EP) .................................... 13155926

(51) Int. Cl.
*G01R 31/40* (2014.01)
*G01R 31/327* (2006.01)
(Continued)

(52) U.S. Cl.
CPC ......... *G01R 31/40* (2013.01); *G01R 31/3272* (2013.01); *G01R 31/3275* (2013.01);
(Continued)

(58) Field of Classification Search
CPC ................ G01R 31/26; G01R 31/2642; G01R 31/2648; G01R 31/2831; G01R 31/31702
See application file for complete search history.

(56) References Cited

U.S. PATENT DOCUMENTS

| 5,742,513 A | 4/1998 | Bouhenguel et al. |
| 6,356,057 B1 * | 3/2002 | Shilo ...................... G01R 31/40 320/127 |

(Continued)

FOREIGN PATENT DOCUMENTS

| EP | 0 666 629 | 8/1995 |
| EP | 0 935 327 | 8/1999 |

(Continued)

*Primary Examiner* — Tung X Nguyen
(74) *Attorney, Agent, or Firm* — Preti Flaherty Beliveau & Pachios LLP (57) ABSTRACT

A method for testing multiple spatially distributed protective devices of an energy supply network. Each of the protective devices is configured to, in the event of a fault occurring in the energy supply network, isolate the fault in the energy supply network. The method comprises: producing an initial test sequence; outputting of the test sequence to the protective devices; detecting outputs of the protective devices that the protective devices output on the basis of the test sequence; analyzing the outputs and generation of inputs for the protective devices depending on the outputs. If the inputs are not part of the test sequence, these inputs are incorporated into the test sequence and the outputting step proceeds. Otherwise, all outputs of the protective devices are evaluated. Each test sequence comprises inputs in the form of process variables of the energy supply network for at least one of the protective devices.

13 Claims, 2 Drawing Sheets

(51) Int. Cl.
*H02H 3/00* (2006.01)
*H02H 3/04* (2006.01)
*H02H 7/26* (2006.01)
*H02H 1/00* (2006.01)

(52) U.S. Cl.
CPC ............ *H02H 3/006* (2013.01); *H02H 3/044* (2013.01); *H02H 7/261* (2013.01); *H02H 1/0092* (2013.01)

(56) References Cited

U.S. PATENT DOCUMENTS 9,030,225 B2 * 5/2015 Huang ................... G01R 31/40
　　　　　　　　　　　　　　　　　　　　324/527
2016/0003921 A1 1/2016 Hensler et al.

FOREIGN PATENT DOCUMENTS

EP          2 770 597 A1    8/2014
WO    WO 2014/128144 A1    8/2014

* cited by examiner

Fig. 2

METHOD FOR TESTING MULTIPLE SPATIALLY DISTRIBUTED PROTECTIVE DEVICES OF AN ENERGY SUPPLY NETWORK, AND CORRESPONDING TESTING SYSTEM

STATEMENT REGARDING FEDERALLY SPONSORED RESEARCH OR DEVELOPMENT n/a

BACKGROUND OF THE INVENTION

Technical Field

The present invention relates to a method and a testing system for testing and/or testing multiple spatially distributed protective devices, which are used to protect an energy supply network (e.g. a high-voltage network).

Background Art

Protective devices for energy supply networks comprise one or more protective units, which monitor process variables (e.g. current, voltage and also switching states of e.g. circuit breakers or states of e.g. transformers) of the energy supply network and analyse them for faults. If the protective device detects a fault in a protection area of the energy supply network assigned to it by this analysis, the protective device outputs switching commands in order to activate a circuit breaker in particular, with which the detected fault is isolated by cutting off the corresponding part of the energy supply network. To do this, the circuit breaker interrupts the flow of energy of the energy supply network in that the circuit breaker interrupts e.g. a line of the energy supply network or the energy flow on one side of a transformer. Moreover, some protective devices and protective units are able after a certain pause time to output switching commands in order to close the previously opened circuit breaker again. If the fault is no longer present when the circuit breaker is closed, the protective device or protective unit returns to normal monitoring of the energy supply network. If on the other hand the fault should still be present on closing the circuit breaker, the protective device or the protective unit recognises this, so that the circuit breaker is immediately reopened by the protective device or protective unit.

An energy supply network is understood in particular to mean a network comprising lines that have voltages of more than 10 kV among them. The energy supply network meant here comprises energy transmission networks with voltages of over 100 kV on the one hand and so-called energy distribution networks with voltages of over 10 kV (e.g. of 20 kV) on the other hand. This can be alternating voltage (e.g. 50 Hz) or direct voltage. A circuit breaker is configured to interrupt an active electrical connection of such a high-voltage line. A circuit breaker can switch high overload currents and short-circuit currents (up to 800 kA), therefore, and must be able to hold these for a predetermined timespan and switch them off again.

The testing of these protective devices is carried out according to the prior art mostly by testing of the individual protective device in an isolated test. Proof of the correct system behaviour, i.e. the correct interaction of all components (especially protective devices) is normally provided according to the prior art not by a function test but by a review of the corresponding technical documents.

BRIEF SUMMARY OF THE INVENTION

The object of the present invention, therefore, is to improve the testing of spatially distributed protective devices of an energy supply network so that even the correct interaction of the spatially distributed protective devices is verified using test sequences generated for this purpose.

This object is achieved according to the invention by a method for testing multiple spatially distributed protective devices of an energy supply network according to claim 1, by a testing system for testing multiple protective devices of an energy supply network arranged at spatially distributed locations according to claim 10, by a control device according to claim 12 and by a computer program product according to claim 13. The dependent claims define preferred and advantageous embodiments of the present invention.

In the scope of the present invention, a method is provided for testing multiple spatially distributed protective devices of an energy supply network. Each of these protective devices is configured so as to, upon detection of a fault in an area of the energy supply network monitored by the respective protective device, isolate this fault (in particular by opening an assigned circuit breaker). The method according to the invention comprises the following steps:

a) generating an initial test sequence with which one or more protective devices can be tested and/or tested. In this case each test sequence comprises both inputs for the protective device to be tested in the form of process variables of the energy supply network and can also comprise target outputs (test responses), which are to be outputted by the protective device tested in each case depending on the inputs.

b) outputting or applying of the test sequence to the protective devices.

c) detecting the outputs of the protective devices tested, wherein the respective protective device outputs these outputs on the basis of the test sequence applied to the respective protective device.

d) analysing the outputs and generating inputs for the protective devices depending on the outputs. If the outputs of a protective device (for example, a switching command to open a circuit breaker) lead to changes in the process variables of other protective devices, inputs (in the form of the changed process variables) are generated for these other protective devices corresponding to these outputs.

If these (newly) generated inputs are not yet part of the test sequence, the test sequence is expanded by the corresponding (newly) generated inputs, and the method returns to step b or proceeds with step b.

If on the other hand the (newly) generated inputs are already part of the test sequence, the method continues in the following step e.

e) evaluating the outputs of the protective devices. It is verified at the latest in this step whether the outputs generated by the protective devices during testing correspond to the target outputs, which can be part of the test sequence, for example. In this case a target outputs establishes in particular what (for example, in the form of binary data) the respective protective device should output and when the respective protective device should output the target output (e.g. after a first time interval and before the end of a second time interval, which both commence with the application of the test sequence). The result of the evaluation of all outputs of the protective devices is whether the protective devices have correctly executed the test sequence or not.

Steps b) and c) take place in particular synchronously in time, so that the test sequence is applied by all testing devices synchronously to the protective devices and simultaneous outputs receive the same time stamp. This is achieved by highly precise clocks in the testing devices, which are synchronised e.g. by GPS. Due to this, the points in time at which certain outputs of the protective devices are detected can also be taken into account in the analysis in step d) or in the evaluation in step e).

In contrast to the prior art, the interaction of various protective devices is advantageously also verified, even if these protective devices are located spatially apart from one another. Spatially distributed protective devices are understood to mean that at least two of these protective devices are at least 1 km apart from one another. It is also possible, however, that at least two of these protective devices are several 10 km, several 100 km or even several 1000 km apart from one another.

The outputs of the respective protective device can comprise both a switch opening command, with which a circuit breaker is opened, and a reclose command, with which the circuit breaker is closed once more.

If the inputs for the protective devices are currents or voltages, these can be defined by the indication of fixed amplitudes, phase angles and/or frequencies. Moreover, these inputs can also be defined in the form of a ramp, however, in that the amplitude of a voltage or a current, for example, increases or decreases within a certain timespan from a first value to a second value.

As both the opening and reclosing of circuit breakers is taken into account when testing the protective devices, the system, which comprises the energy supply network in addition to the spatially distributed protective devices to be tested, is advantageously tested in its interaction. Since the observed switching commands (for the circuit breakers) are reflected in the process variables, the opening and reclosing of the circuit breakers is advantageously simulated in the testing of the protective devices according to the invention.

The generation of new inputs depending on the detected outputs (e.g. switching commands) of the protective devices is carried out in particular with the aid of a model of the energy supply network protected by the protective devices. Starting out from the outputs detected, changes in the process variables of the energy supply network are determined with the aid of this model, from which changes the inputs for the protective devices to be tested are then derived.

By using the model of the energy supply network, the temporal behaviour of process variables of the energy supply network can advantageously be determined or simulated at a first location (i.e. for a first protective device) if a circuit breaker is closed at a second location (for example, by a switching command of a second protective device). In other words, the effects of outputs (e.g. switching commands) of the second protective device on the process variables detected by the first protective device can be simulated by the model of the energy supply network, even if the two protective devices lie many kilometers apart.

According to the invention this model can be a static, a dynamic or a transient model.

The static model models the steady state of the energy supply network, while the dynamic model can additionally model switching processes of e.g. circuit breakers. The transient model is the most accurate of the three, as the transient model models the process variables of the energy supply network even in the case of switching processes with an exact time response.

The protective device protects the energy supply network or more precisely the area of the energy supply network assigned to the protective device, in that the protective device outputs a switching command upon detection of a fault in the energy supply network. The switching command is transmitted to a circuit breaker assigned to the protective device, which breaker upon receipt of this switching command interrupts a high-voltage line or a part of the energy supply network, in order thereby to protect the area of the energy supply network protected by the protective device from the effects of the fault.

To monitor the energy supply network, the protective device detects process variables of the energy supply network, such as a current flowing in a high-voltage line, for example, or a high voltage existing between two high-voltage lines. To do this, the voltage or the current is advantageously converted with the aid of a transformer connected to the energy supply network of the respective protective device, so that the protective device can monitor the process variables in the form of a comparatively low voltage (e.g. 100 V) and/or in the form of a comparatively low current (e.g. 1 A). Moreover, alternative transformers exist (e.g. Rogowski transformers), which convert the high voltage and/or heavy current directly into small signals (mV range) or digital signals, which are then monitored by the connected protective device. Depending on the process variables converted in this way, the protective device determines whether a fault is present in the energy supply network. The fault is present in this case, for example, if the current rises above a current threshold or if the voltage drops below a voltage threshold.

The test sequence of the protective device to be verified can be injected or specified in the form of small signals, digital signals (e.g. via a network connection (e.g. LAN)) (in accordance with IEC 61850-9-2). It is also possible, however, that the test sequence is specified in the form of classic analogue signals (volt range).

Moreover, it is possible that one of the protective devices has a communications connection via a communications channel with a low latency period (for example, via an optical fibre also carried on the high-voltage line) with another of the protective devices. Due to this, these two protective devices can detect information (e.g. process variables, fault states or (impending) switching commands) from the other protective device in each case virtually in real time. Depending on this information, the respective protective device can decide whether, in the event of the occurrence or presence of a fault in the energy supply network, the fault is isolated or not by the respective protective device.

If, for example, a protective device detects a fault with reference to the process variables detected by it and at the same time learns from the information transmitted to it via the communications channel that this fault has also been detected by another protective device, the protective device can delay the opening of the circuit breaker assigned to it, for example, in order to wait and see whether the fault can be isolated by the other protective device.

The present invention can also comprise a test in which the communications channel described above between the protective devices is deliberately interrupted, in order thus to verify the so-called back-up behaviour and the reserve protection (i.e. the protective behaviour without communications channel) of the protective devices.

The method according to the invention is advantageously executed automatically by a central control device, which has a communications connection with each protective device to be tested, for example via testing devices.

As the locally distributed testing devices each have a communications connection with the central control device, each testing device can advantageously be operated and controlled by the control device on the one hand. On the other hand, the testing results of all protective devices that are detected by the respective testing device are available centrally in the control device.

According to another embodiment according to the invention, a sequence of output steps can be specified. Each of these output steps defines or comprises one or more inputs or test variables. An input or test variable is understood to mean at least one element from the following group:

An input in the form of process variables (e.g. current, voltage) of the energy supply network for a protective device.

A state (e.g. switching state) of a circuit breaker, a state (e.g. switching state) of an isolator or another binary process variable connected to a binary input of the protective device.

Information or data, which are transmitted by one protective device via a communications channel to another protective device.

The output steps are outputted as the test sequence to the protective devices. Here an order in which the output steps are outputted to the protective devices is determined by so-called trigger events. In other words, the order in which trigger events occur specifies the order in which the output steps are outputted to the protective devices as a test sequence. Each of the trigger events can be formed depending on at least one event from an event group, wherein the event group comprises the following events:

An event that occurs when a predefined timespan has elapsed.

An event that occurs upon arrival of a certain item of data, which is transmitted by one protective device via a communications channel to another protective device.

An event that occurs when a certain circuit breaker opens.

An event that occurs when a certain circuit breaker closes.

Another event, which occurs (e.g. in the event of a predefined change in a process variable) and can be detected by the testing device by the evaluation of the binary inputs.

In this case the occurrence of a certain trigger event can lead to the immediate termination of the current output step or to a delayed termination of the current output step. Following the termination of the current output step, an output step dependent on the respective trigger event is activated. It is also possible here that the output steps have a predefined order and that following the termination of the current output step, the following output step according to this order is activated if no other output step is defined by the triggering trigger event. The output step following the current output step can be dependent either only on the current output step (in this case a trigger event determines the time of the transition from the current to the following output step), only on the trigger event present or on both the current output step and on the present trigger event.

In other words, when a certain trigger event occurs, the test variables or inputs which act on the protective devices according to the current output step are replaced immediately or with a delay by the test variables or inputs that are defined by the next output step, which follows the terminated output step depending on the present trigger event.

A trigger event can be present if precisely one event from the aforementioned event group is present. For example, a trigger event can occur if a circuit breaker is closed, while another trigger event can occur if the same circuit breaker is opened. It is also possible, however, that a certain trigger event is defined by the logical linking of multiple events. For example, a trigger event can be present if two (or more) circuit breakers close respectively (logical AND), while another trigger event can be present if at least one of two (or more) circuit breakers closes (logical OR).

According to the further embodiment, the inputs for the protective devices are produced in particular not only depending on the outputs of the protective devices, but the inputs can also change after a predetermined timespan has elapsed (independently of the outputs).

In the further embodiment described here, the generation of inputs for the protective devices takes place depending on the outputs of the protective devices with reference to the specified output steps, while the inputs in the embodiments described above are determined, for example, with reference to a model of the energy supply network depending on the outputs. In this further embodiment, in contrast to the production of inputs based on a network simulation (i.e. on the model of the energy supply network), a state change is thus also possible, which would not occur in reality. This advantageously opens up additional options in which relatively simply determined fault scenarios can be tested, which can only be generated in reality with great difficulty (if at all).

Even in this embodiment, the reaction of a single or a multiple of protective devices influences the production of the final test sequence. Furthermore, possible latency periods on the communications connection between the testing devices prevent a conventional production of the final test sequence without recursion. In other words, the present invention is also required for the production of the final test sequence and thus for testing multiple spatially distributed protective devices if the inputs for the protective devices are obtained with the aid of the specified output steps depending on the outputs of the protective devices (as the other embodiment describes).

In particular, the initial test sequence according to the further embodiment is outputted to the protective devices without events or trigger events (i.e. without switching reactions of circuit breakers). Then the reactions of the protective devices to the (initial) test sequence are evaluated and the corresponding trigger events calculated with which further inputs for the protective devices are then produced, due to which the test sequence is expanded. This expanded test sequence is outputted afresh to the protective devices, which can then lead to further trigger events. This loop is repeated until no further relevant outputs of the protective devices that would lead to a further adaptation of the test sequence are detected.

A testing system is also provided in the scope of the present invention with which multiple protective devices of an energy supply network arranged at spatially distributed locations (e.g. substations) are tested or tested. The testing system here comprises a control device and multiple testing devices. At least one of the testing devices is present at each location of the protective devices. The control device has a communications connection to each of these testing devices. The respective testing device is configured to test one or more protective devices that are present at the same location as the respective testing device. Furthermore, the testing system is configured to execute the method according to the invention.

The advantages of the testing system according to the invention correspond to the advantages of the method according to the invention, which have been listed previously in detail, so that repetition is dispensed with here.

The control device can be integrated with one of the testing devices, so that the control device and the corresponding testing device are integrated in the same device.

Moreover, a control device for a testing system for testing multiple spatially distributed protective devices of an energy supply network is provided. The control device is configured to communicate with multiple testing devices via corresponding communications connections (e.g. Internet, telephone network), which are assigned respectively to one or more protective devices. Each of these testing devices is configured to test one or more protective devices. The control device itself is configured to execute the method according to the invention.

The communications connection with which the testing devices communicate with the control device can also be a slow connection with a high latency period (for example a mobile network, UMTS), since the present invention advantageously does not make any real-time demands with reference to this communications connection.

Furthermore, the present invention describes a computer program product, in particular a computer program or software, which can be loaded into a memory of a programmable controller or a computer. Using this computer program product all or various previously described embodiments of the method according to the invention can be executed if the computer program product is running in the controller or in the computer. The computer program product possibly requires program means, e.g. libraries and help functions, to realise the corresponding embodiments of the methods. In other words, with the claim directed to the computer program product, a computer program or software in particular, with which one of the embodiments of the method according to the invention described above can be executed or which executes this embodiment, is to be placed under protection. The software can be a source code (e.g. C++), which still has to be compiled (translated) and embedded or which only has to be interpreted, or an executable software code, which is only to be loaded into the corresponding processing unit (computer) for execution.

The present invention is to be illustrated once again below from a different perspective.

The present invention tests or tests multiple spatially distributed protective devices of an energy supply network. In particular, process variables at the installation locations of the protective devices to be tested are calculated by a corresponding model of the energy supply network and with the aid of the testing devices are specified to the protective devices for testing. Thus normal operation, fault states and off modes are modelled or simulated, so that the protective devices are tested in different operating modes and states of the system (energy supply network including protective devices). The model used for calculating the process variables has an influence on the exact values of the process variables on the one hand and an influence on the progression of the process variables as they appear when a fault occurs or when the circuit breakers are switched on the other hand. For this the following problem has to be solved. The delay times that occur in a transmission of a switching process for a circuit breaker via the communications network (e.g. Internet, telephone network), via which the testing devices are connected to the control device, exceed by far the propagation velocity of the effects of the switching process via the energy supply network. The present invention solves this problem in that the test sequence is built up or expanded in stages. The premise is started out from that the respective protective device behaves deterministically, so that the respective protective device (including the assigned circuit breaker) exhibits identical behaviour within certain tolerances (for example, when outputting switching commands) upon repeated application of the same test variables.

To execute the present invention, the testing devices supply in particular analogue current/voltage inputs of the protective devices with corresponding test variables or inputs. It can also be helpful for testing if certain binary inputs of the protective devices, with which switch settings of circuit breakers are signalled, for example, are supplied with corresponding test variables or inputs.

Compared with the prior art, the present invention offers the following advantages:

The results of the tests of all protective devices are available in particular on the central control device and can therefore be evaluated centrally.

Since the reaction of the energy supply network to switching commands is also taken into account in the test of the protective devices, feedback takes place in particular between the system to be tested (energy supply network with protective devices) and the model of the system used for the test.

All outputs of the protective devices in particular also reclose commands for circuit breakers) can be taken into account in the test.

The test according to the invention also tests correct behaviour of the system in respect of cycles of opening and reclosing of circuit breakers, so that discrepancies occurring due to incorrect settings of the various protective devices and non-synchronous system behaviour are taken into account in the test and lead to a negative result of the test if applicable.

The present invention is suitable for carrying out tests of protective devices with which an energy supply network is protected. Self-evidently the present invention is not restricted to this preferred application area, since protective devices that have just been manufactured or serviced can also be tested using the present invention.

BRIEF DESCRIPTION OF THE SEVERAL VIEWS OF THE DRAWINGS

The present invention is explained in greater detail below with reference to the enclosed drawing, with reference to preferred embodiments according to the invention.

DETAILED DESCRIPTION OF THE INVENTION

Figure 1:
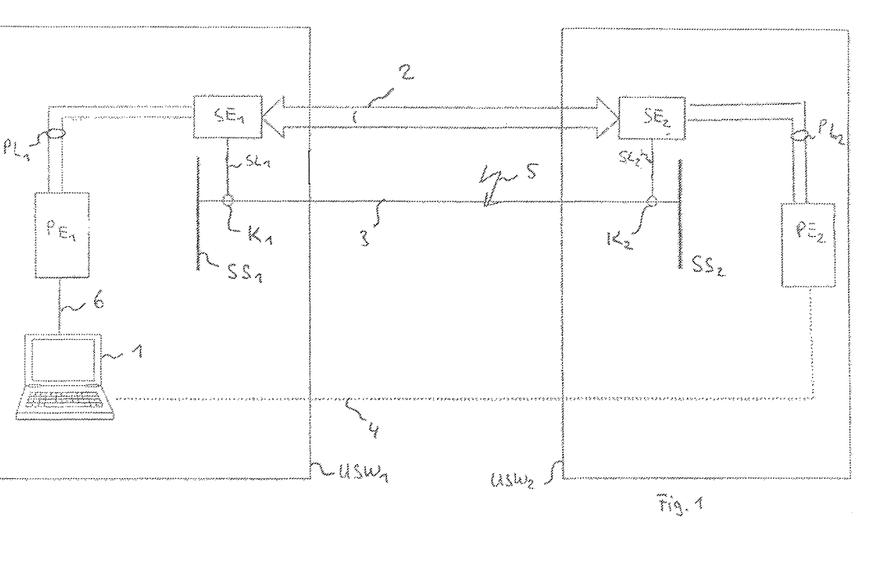
In FIG. 1 a testing system according to the invention is shown together with an energy supply network, which is protected by two protective devices.

FIG. 1 shows an energy supply network in the form of a single transmission line 3. According to the invention, an energy supply network can comprise multiple transmission lines, other high-voltage lines, parallel lines and transformers, which are connected in the form of a network. The transmission line 3 ends at both ends respectively at a bus bar $SS_1$, $SS_2$ in different substations $UW_1$, $UW_2$. Inside the respective substation is a circuit breaker, with which the electrical connection between the part of the transmission line 3 connecting the two substations $UW_1$, $UW_2$ and the respective bus bar $SS_1$, $SS_2$ can be interrupted. Moreover, located inside the respective substation $UW_1$, $UW_2$ is a transformer, with which a heavy current (phase current) carried by the transmission line 3 and a high voltage present at the transmission line 3 are converted, wherein the result of this conversion in the form of a current and a voltage of low amplitude (e.g. 1 A and 100 V) are supplied to the respective protective device as process variables. The respective protective device monitors the energy supply network and the transmission line 3 with reference to these process variables. The point at which the respective circuit breaker and the respective transformer are located is designated $K_1$ or $K_2$ in FIG. 1.

When a fault 5 (for example, a short circuit) occurs in the transmission line 3, the respective protective device $SE_1$; $SE_2$ detects this fault 5 with reference to the process variables, in that the current increases above a current threshold or the voltage falls below a voltage threshold, for example. As soon as the respective protective device $SE_1$; $SE_2$ detects the fault 5, it outputs a switching command to the circuit breaker assigned to it, in order to interrupt the electrical connection and thus isolate the fault 5. After a predetermined pause time following detection of the fault 5, the respective protective device $SE_1$; $SE_2$ outputs a switching command to the circuit breaker assigned to it in order to restore the electrical connection. If the fault 5 still exists at this time, the respective protective device $SE_1$; $SE_2$ detects this with reference to the process variables of the transmission line 3 supplied to it and outputs a further switching command, in order to interrupt the electrical connection again using the circuit breaker assigned to it.

Moreover, the two protective devices are connected by communications technology via a communications channel 2. Via this communications channel 2 the two protective devices $SE_1$, $SE_2$ can transmit certain information (e.g. process variables, switching commands) to one another virtually in real time.

To test the protective devices $SE_1$, $SE_2$, a testing device $PE_1$, $PE_2$ exists in each substation $UW_1$, $UW_2$, wherein the respective testing device $PE_1$, $PE_2$ is connected by a testing line $PL_1$, $PL_2$ to the protective device $SE_1$; $SE_2$ arranged in the same substation $UW_1$, $UW_2$ In addition, a central controller 1 exists, which is connected via a communications line 6 and a WAN communications connection 4 to both testing devices $PE_1$, $PE_2$.

The testing devices $PE_1$, $PE_2$ are each equipped with a very accurately working clock, wherein the clocks of the testing devices $PE_1$, $PE_2$ are mostly synchronised by GPS, in order to show exactly the same time. Synchronous clocks are of great importance when applying the test sequence and when detecting the outputs of the individual protective devices $SE_1$, $SE_2$.

To test the protective devices $SE_1$, $SE_2$, the protective devices $SE_1$, $SE_2$ are separated from the energy supply network 3 by interrupting the control lines $SL_1$, $SL_2$. During the test the protective devices $SE_1$; $SE_2$ receive the process variables normally acquired by them via the transformer via the respective testing line $PL_1$; $PL_2$, and output the switching commands that are outputted via the control line $SL_1$, $SL_2$ in normal operation via this testing line $PL_1$; $PL_2$. The energy supply network is thus not protected by the protective devices $SE_1$, $SE_2$ during the test, but it is not disturbed by switching commands initiated by the test either.

Figure 2:
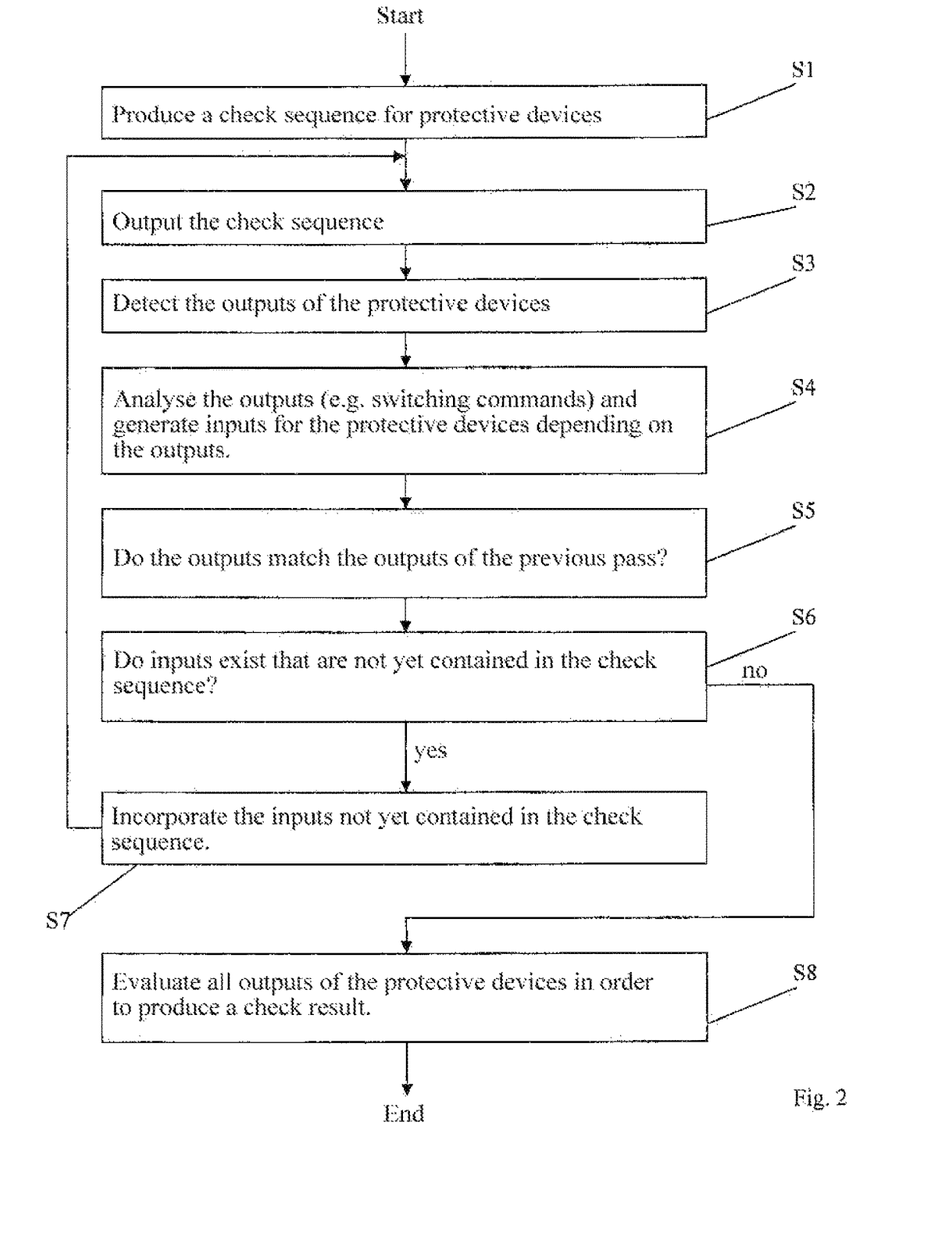
FIG. 2 shows a flow chart of a method according to the invention.

FIG. 2 shows a flow chart of a method according to the invention for testing multiple spatially distributed protective devices $SE_1$, $SE_2$ of an energy supply network.

In step S1 a test sequence is produced for one, more or all protective devices $SE_1$, $SE_2$ to be tested. It is to be verified using this test sequence whether the respective protective device $SE_1$; $SE_2$ behaves correctly at the transition from normal operation to a fault state (i.e. the respective protective device $SE_1$; $SE_2$ detects a fault in the energy supply network). To do this, process variables, which would be detected in the event of a fault in the energy supply network or the transmission line 3, are supplied to the respective protective devices $SE_1$, $SE_2$ via the testing line $PL_1$; $PL_2$.

In step S2, the test sequence is distributed by the control device 1 to the testing devices $PE_1$, $PE_2$ and outputted by these testing devices $PE_1$, $PE_2$ to the respective protective devices $SE_1$, $SE_2$ at exactly the same time, in that corresponding test patterns are supplied to the respective protective device $SE_1$; $SE_2$ via the respective testing line $PL_1$; $PL_2$. The reaction of the protective devices $SE_1$, $SE_2$ to these test patterns is detected in step S3, in that the outputs of the respective protective device $SE_1$; $SE_2$ are detected by the respective testing device $PE_1$, $PE_2$ on the respective testing line $PL_1$, $PL_2$ and are provided with a very accurate time stamp. These outputs comprise switching commands to the circuit breakers assigned to the respective protective device $SE_1$; $SE_2$, for example.

In step S4, the outputs (in particular switching commands) detected in the previous step S3 are analysed. In this analysis it is verified whether an output of a protective device $SE_1$, $SE_2$ changes the process variables of the energy supply network 3, which is the case, for example, if the outputs comprise a switching command to open a currently closed circuit breaker. With the aid of a model of the energy supply network 3, the process variables at all the points $K_1$, $K_2$ of the energy supply network 3 at which the process variables are tapped by the protective devices $SE_1$, $SE_2$ in normal operation (non-testing operation) are simulated in this case, starting out from the switching commands detected in step S3. From the process variables simulated in this way, corresponding inputs are yielded for the protective devices $SE_1$, $SE_2$. (For example, a switching command of protective device $SE_1$ leads to the opening of the circuit breaker at $K_1$ and thus to a change in the process variables at point $K_2$, which leads in turn to a change in the inputs supplied to protective device $SE_2$ via the testing line $PL_2$.)

If step S5 is run through at least for a second time, it is verified in step S5 whether the current outputs match the outputs of the previous pass within certain tolerances (deterministic). A negative result of step S5 does not necessarily lead to a negative test result. In a normal case, the method is repeated at a negative result in step S5, wherein the tolerances are increased if necessary. The result of step S5 can also be assessed manually. In this case the method is only repeated following a negative result if the technician supervising the test consents.

In step S6 it is verified whether the inputs generated in the previous step S4 are already contained in the test sequence. This will most probably not be the case in the first pass of step S6 if switching commands were detected in step S3. If inputs exist that are not yet contained in the test sequence, these inputs are incorporated into the test sequence in step S7. Then the method according to the invention resumes again at step S2. It is thus a recursive method.

In a fresh pass of steps S2 to S6, the transition from normal operation to a fault state and from there to the state following switching processes of the circuit breakers initiated by the protective devices $SE_1$, $SE_2$ is tested using the test sequence modified in the last step S7. It is verified again here in step S6 whether outputs (in particular switching commands) are present in the previous step S4 that were not yet present in the previous pass. This is the case, for example, if one of the protective devices $SE_1$, $SE_2$ outputs a switching command to reclose the circuit breaker assigned to it.

The method runs through the steps S2 to S6 until the protective devices $SE_1$, $SE_2$ do not output any further or new outputs (in particular switching commands). If this is the case, the method branches to step S8, in which the outputs of the protective devices $SE_1$, $SE_2$ that were detected by the corresponding testing devices are evaluated to produce a testing result.

The incorporation of further inputs into the test sequence normally also comprises the incorporation of target outputs, which are to be outputted by the protective devices $SE_1$, $SE_2$ on the basis of the newly incorporated inputs. For this reason also it is possible that it is verified, for example, in step S4 in the analysis of the outputs whether the outputs of the protective devices $SE_1$, $SE_2$ detected respectively by the testing devices $PE_1$, $PE_2$ are correct, or whether a malfunction of the protective devices $SE_1$, $SE_2$ was already detected, which could lead to a negative test result and thus to a premature termination of the test.

Moreover, in each further pass of the steps S2 to S6 it can be verified whether the outputs of the protective devices $SE_1$, $SE_2$ correspond to the outputs of the protective device $SE_1$; $SE_2$ in the previous pass in each case, thus whether in particular the same switching commands have been outputted. If this is not the case, the test can likewise be terminated with a negative result.

REFERENCE SYMBOL LIST

1 Controller
2 Communications channel
3 Transmission line
4 WAN communications connection
5 Fault
6 Communications line
$K_1$, $K_2$ Nodes (circuit breaker and transformer)
$PE_1$, $PE_2$ Testing device
$PL_1$, $PL_2$ Testing line
$SL_1$, $SL_2$ Control line
S1-S8 Method step
$SS_1$, $SS_2$ Bus bar
$USW_1$, $USW_2$ Substation

The invention claimed is:

1. Method for testing multiple spatially distributed protective devices of an energy supply network, wherein each of the protective devices is configured in order so as to, in the event of a fault occurring in the energy supply network, isolate the fault in the energy supply network, wherein the method comprises the following steps:
  a: production of an initial test sequence,
  b: outputting of the test sequence to the protective devices,
  c: detection of outputs of the protective devices that the protective devices output on the basis of the test sequence,
  d: analysis of the outputs and generation of inputs for the protective devices depending on the outputs, wherein, if the inputs are not part of the test sequence, these inputs are incorporated into the test sequence and step b is proceeded with, while otherwise step e is proceeded with, and
  e: evaluation of all outputs of the protective devices, wherein each test sequence comprises inputs in the form of process variables of the energy supply network for at least one of the protective devices.

2. Method according to claim 1, wherein the outputs of the at least one of the protective devices comprise a switch opening command, with which a circuit breaker is opened to isolate the fault, and/or a reclose command, with which an isolation of a fault is cancelled again by closing a circuit breaker.

3. Method according to claim 1, wherein the generation of inputs takes place depending on the outputs, in that starting out from the outputs, changes in the process variables of the energy supply network are determined with reference to a model of the energy supply network.

4. Method according to claim 3, wherein the model is a static, a dynamic or a transient model.

5. Method according to claim 1, wherein upon the occurrence of a fault in the energy supply network, a command to open a circuit breaker is outputted by each protective device in order to isolate the fault.

6. Method according to claim 1, wherein for each of the protective devices the process variables of the energy supply network are detected via a transformer connected to the energy supply network, and it is determined depending on the process variables whether a fault is present in the energy supply network.

7. Method according to claim 1, wherein one of the protective devices is connected via a communications channel to another of the protective devices, that the protective device acquires information from the other protective device via the communications channel, and wherein it is decided depending on the information whether, in the event of a fault occurring in the energy supply network, the fault is isolated by the protective devices.

8. Method according to claim 1, wherein the method is executed automatically by a central control device.

9. Method according to claim 1, wherein output steps are specified, with each of the output steps comprising at least one input, and the output steps being outputted as the test sequence to the protective devices in an order dependent on trigger events, wherein each trigger event is dependent on at least one event from an event group, wherein the event group comprises:
  expiry of a predetermined timespan,
  arrival of a certain item of data from one of the protective devices via a communications channel at another of the protective devices, and
  a switch setting of a circuit breaker is changed.

10. Testing system for testing multiple protective devices of an energy supply network arranged at spatially distributed locations, wherein the testing system comprises a control device and multiple testing devices, wherein at least one of the testing devices is present at each location of the protective devices, wherein the control device has a communications connection to each of the testing devices, wherein each of the testing devices is configured to test at least one of the protective devices, which is present at the same location as the respective testing device, and wherein the testing system is configured to, in the event of a fault occurring in the energy supply network, isolate the fault in the energy supply network by:
  producing an initial test sequence;
  outputting the test sequence to the protective devices;
  detecting outputs of the protective devices that the protective devices output on the basis of the test sequence;
  analyzing the outputs and generating inputs for the protective devices depending on the outputs wherein, if the inputs are not part of the test sequence, the inputs are incorporated into the test sequence prior to the outputting of the test sequence to the protective devices; and
  evaluating all outputs of the protective devices, wherein each test sequence comprises inputs in the form of process variables of the energy supply network for at least one of the protective devices.

11. Testing system according to claim 10, wherein the control device is integrated into one of the testing devices.

12. Control device for a testing system for testing multiple spatially distributed protective devices of an energy supply network, wherein the control device is configured to communicate with multiple testing devices assigned respectively to the protective devices, wherein each testing device is configured to test at least one of the protective devices, wherein each of the protective devices is configured in order so as to, in the event of a fault occurring in the energy supply network, isolate the fault in the energy supply network, the control device configured to;
  produce an initial test sequence;
  output the test sequence to the protective devices;
  detect outputs of the protective devices that the protective devices output on the basis of the test sequence;
  analyze the outputs and generate inputs for the protective devices depending on the outputs wherein, if the inputs are not part of the test sequence, the inputs are incorporated into the test sequence prior to the outputting of the test sequence to the protective devices; and
  evaluate all outputs of the protective devices,
  wherein each test sequence comprises inputs in the form of process variables of the energy supply network for at least one of the protective devices.

13. Computer program product with computer-readable instructions stored on it, which are configured in such a way that upon execution of these instructions by a computer, a method for testing multiple spatially distributed protective devices of an energy supply network is executed, wherein each of the protective devices is configured in order so as to, in the event of a fault occurring in the energy supply network, isolate the fault in the energy supply network, wherein the method comprises the following steps:
  a: production of an initial test sequence,
  b: outputting of the test sequence to the protective devices,
  c: detection of outputs of the protective devices that the protective devices output on the basis of the test sequence,
  d: analysis of the outputs and generation of inputs for the protective devices depending on the outputs, wherein, if the inputs are not part of the test sequence, these inputs are incorporated into the test sequence and step b is proceeded with, while otherwise step e is proceeded with, and
  e: evaluation of all outputs of the protective devices,
  wherein each test sequence comprises inputs in the form of process variables of the energy supply network for at least one of the protective devices.

* * * * *